United States Patent
Zare et al.

(10) Patent No.: US 11,823,724 B2
(45) Date of Patent: Nov. 21, 2023

(54) MAGNETO-ELECTRIC LOW POWER ANALOGUE MAGNETIC TUNNEL JUNCTION MEMORY

(71) Applicant: International Business Machines Corporation, Armonk, NY (US)

(72) Inventors: Saba Zare, White Plains, NY (US); Dimitri Houssameddine, Sunnyvale, CA (US); Karthik Yogendra, Albany, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 17/510,436

(22) Filed: Oct. 26, 2021

(65) Prior Publication Data

US 2023/0131445 A1    Apr. 27, 2023

(51) Int. Cl.
| | | |
|---|---|---|
| *G11C 11/16* | (2006.01) | |
| *H10B 61/00* | (2023.01) | |
| *H10N 50/80* | (2023.01) | |
| *H10N 50/01* | (2023.01) | |
| *H10N 50/85* | (2023.01) | |
| *H10N 50/10* | (2023.01) | |

(52) U.S. Cl.
CPC ........ *G11C 11/161* (2013.01); *G11C 11/1655* (2013.01); *G11C 11/1673* (2013.01); *G11C 11/1697* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC .............. G11C 11/161; G11C 11/1655; G11C 11/1673; G11C 11/1697; G11C 11/1675; H10B 61/00; H10N 50/01; H10N 50/10; H10N 50/80; H10N 50/85
USPC .................................................. 365/158, 173
See application file for complete search history.

(56) References Cited

U.S. PATENT DOCUMENTS

| | | |
|---|---|---|
| 7,335,961 B2 | 2/2008 | Guo |
| 9,276,040 B1 | 3/2016 | Marshall |
| 9,391,265 B2 | 7/2016 | Jan |

(Continued)

FOREIGN PATENT DOCUMENTS

| | | |
|---|---|---|
| CN | 107919435 | 4/2018 |
| CN | 111613722 | 5/2020 |

(Continued)

OTHER PUBLICATIONS

Shi, Shengjie, Spin Orbit Torque Driven Magnetic Switching in Three Terminal Magnetic Tunnel Junctions, 2019, Cornell University. All pages. (Year: 2019).*

(Continued)

*Primary Examiner* — Michael T Tran
(74) *Attorney, Agent, or Firm* — Daniel Morris; Otterstedt & Kammer PLLC (57) ABSTRACT

A device includes a Magnetic Tunnel Junction (MTJ) memory element comprising, a reference layer, a free layer, and a magnetic tunneling layer between the reference layer and the free layer; and a pair of magneto-electric controlling layers, which have in-plane uniaxial anisotropy, wherein the pair of magneto-electric controlling layers are disposed below the free layer.

17 Claims, 7 Drawing Sheets

(56) References Cited

U.S. PATENT DOCUMENTS

| | | |
|---|---|---|
| 9,503,085 B1 | 11/2016 | Bird |
| 9,503,097 B2 | 11/2016 | Lee |
| 10,777,247 B1 | 9/2020 | Sun |
| 2005/0041456 A1* | 2/2005 | Saito .................. G11C 11/16 365/145 |
| 2006/0006334 A1* | 1/2006 | Kadono ............... G11C 11/16 257/E27.005 |
| 2006/0039188 A1* | 2/2006 | Ju ..................... G11C 11/1655 365/158 |
| 2009/0243008 A1* | 10/2009 | Kitagawa ............. H10B 61/00 257/E29.323 |
| 2015/0097159 A1* | 4/2015 | Apalkov ............ G11C 11/1659 257/31 |
| 2017/0352802 A1 | 12/2017 | Nikonov |
| 2018/0005678 A1* | 1/2018 | Foong ............... G11C 11/1655 |
| 2019/0189912 A1* | 6/2019 | Ebrahimi ............. H10N 50/85 |
| 2020/0105831 A1 | 4/2020 | Gajek |
| 2020/0185015 A1* | 6/2020 | Le .................... H10B 61/22 |
| 2020/0193280 A1* | 6/2020 | Torng .................... G11C 11/54 |
| 2020/0234748 A1* | 7/2020 | Kalitsov ............. H01F 10/3236 |
| 2020/0357982 A1* | 11/2020 | Kula .................. G11C 11/1675 |

FOREIGN PATENT DOCUMENTS

| | | | |
|---|---|---|---|
| CN | 112582530 A | 3/2021 | |
| WO | WO-2011121777 A1 * | 10/2011 | ............. B82Y 25/00 |

OTHER PUBLICATIONS

Hao Cai, et al., High Performance MRAM with Spin-Transfer-Torque and Voltage Controlled Magnetic Anisotropy Effects, Applied Sciences 2017, 7, 929, Sep. 2017, pp. 1-13.

Alessio Antolini, et al., Characterization and Programming Algorithm of Phase Change Memory Cells for Analog In-Memory Computing, Materials 2021, 14, 1624, Mar. 2021, pp. 1-19.

Authorized Officer Koskinen, Timo, European Patent Office as ISA, Counterpart PCT Application PCT/ EP2022/078319, ISR & WO on Feb. 17, 2023. Pages: 9.

* cited by examiner

MAGNETO-ELECTRIC LOW POWER ANALOGUE MAGNETIC TUNNEL JUNCTION MEMORY

BACKGROUND

Magnetic Random-Access Memory (MRAM) is an important memory technology. MRAM typically includes a Magnetic Tunnel Junction (MTJ) structure comprising ferromagnetic plates separated by an insulation layer. Conventional MRAM device cells can store only binary states, and are not suitable for computing and AI (artificial intelligence) applications.

Spin Transfer Torque (STT) MRAM is an example MRAM implementation with potential advantages, however, current STT-MRAM technologies use a high current to reorient the magnetization of the MTJ during a write operation.

BRIEF SUMMARY

According to embodiments of the present invention, a device includes a Magnetic Tunnel Junction (MTJ) memory element comprising, a reference layer, a free layer, and a magnetic tunneling layer between the reference layer and the free layer; and a pair of magneto-electric controlling layers, which have in-plane uniaxial anisotropy, wherein the pair of magneto-electric controlling layers are disposed below the free layer.

According to embodiments of the present invention, in a method of operating a device comprising a Magnetic Tunnel Junction (MTJ) memory element comprising, a reference layer, a free layer, and a magnetic tunneling layer between the reference layer and the free layer, and a pair of magneto-electric controlling layers, which have in-plane uniaxial anisotropy, wherein the pair of magneto-electric controlling layer are disposed below the free layer, the method includes applying a voltage across the pair of magneto-electric controlling layers, the voltage enhancing a magnetization of one of the magneto-electric controlling layers and reducing a magnetization in the other magneto-electric controlling layer, and controlling a magnetic field formed through the free layer; and inducing, by the magnetic field, a change in direction of a magnetization of the free layer, which changes a resistance in the MTJ memory element.

According to embodiments of the present invention, in a method of manufacturing a device includes providing a front-end-of-line (FEOL) substrate with bottom connections to an active circuit; forming a pair of magneto-electric controlling layers, which have in-plane uniaxial anisotropy; forming a first and a second magneto-electric controlling contacts electrically connected to the pair of magneto-electric controlling layers and the bottom connections; forming a read line on the pair of magneto-electric controlling layers; forming an Magnetic Tunnel Junction (MTJ) stack comprising, a reference layer, a free layer, and a magnetic tunneling layer between the reference layer and the free layer on the read line; forming a top contact on the reference layer; and forming a bit line contact on the read line.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

an analogue MTJ-based memory device;
a Magneto-Electric (ME) method for programming the MTJ memory device without applying any current through the MTJ junction;
a low power device (e.g., compared to STT-MRAM devices);
enabling a multi-state memory applicable to, for example, analogue memories for AI applications; and
separated read and write paths resulting in improved reliability (e.g., compared to STT-MRAM devices).

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Single-phase Magneto-Electric (ME) materials are typically comprised of magnetic oxides including some heavy metals that can act as insulators and transducers between magnetic and electric systems. An electric field applied to an MR material will generate changes in the magnetization of the MR material. Similarly, a changing magnetic field applied to an electric dipole will be induced an electric polarization in the material. Since the ME materials are insulators, there is no current induced in a film in case of applying a voltage (no power consumption).

Working principles of ME-controlled magnetization change in a magnetic free layer (FL) can be relied on a controllable element of the ME layer. By applying different voltages (i.e., electric fields) into this ME layer, the magnetization of the ME layer can be changed, and thereby the magnetic field sensed by the magnetic FL can be changed and magnetic dipoles will be aligned to the applied magnetic field.

In a device including an ME layer and a FL separated by another non-magnetic layer, a magnetization of the ME layer is in-plane. By increasing of the voltage applied to the ME layer, a magnetization change can be induced in the ME layer. That change of magnetization in the ME layer can induce an increasing amount of the magnetic field on the FL and therefore, more domain will be aligned in a direction of the magnetic field on the FL and so the magnetic density in the FL will be changed (i.e., increased) by the voltage.

Figure 2:
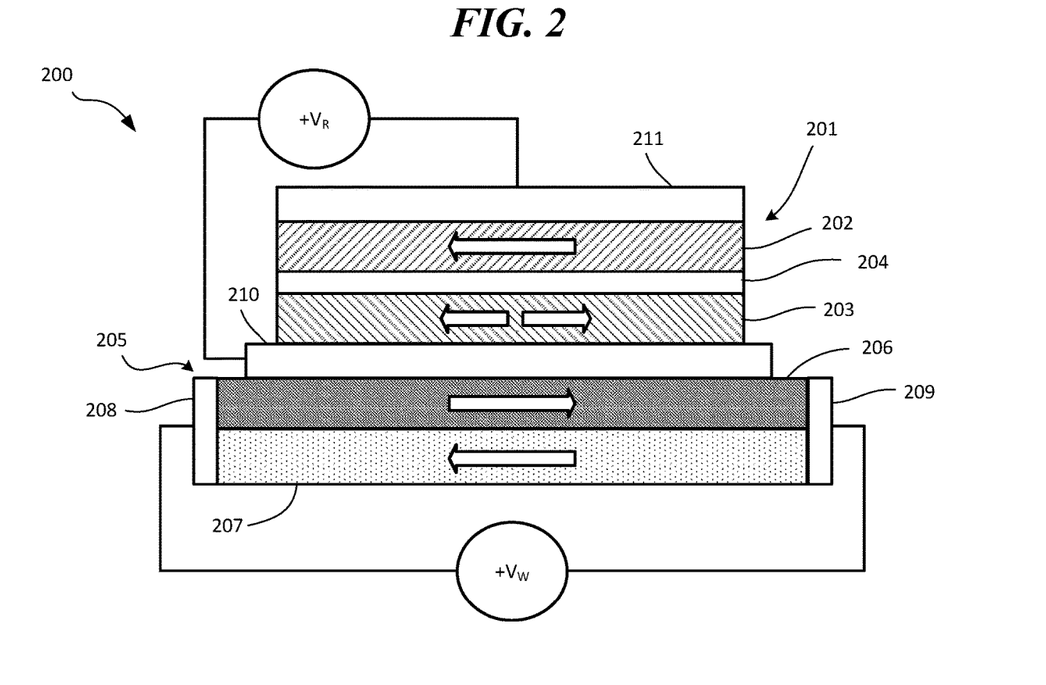
FIG. 2 is a diagram of magnetic domain based device with magnetoelectric layers, a write line, and a decoupled read path according to one or more embodiments of the present invention.

According to embodiments of the present invention and referring to FIG. 2, a device 200 includes a Magnetic Tunnel Junction (MTJ) memory element 201 comprising a reference layer 202 (RL) and a free layer 203, separated by a magnetic tunneling layer 204. The device 200 includes magneto-electric (ME) controlling layers 205. The device 200 includes a first ME layer 206 and a second ME layer 207, which have in-plane uniaxial anisotropy in two different directions.

According to embodiments of the present invention, a net magnetization on the free layer 203 is zero. By applying a voltage ($V_w$) in each direction (in-plane to ME layers) across a first ME controlling contact 208 and a second ME controlling contact 209, the magnetization is enhanced in one of the first ME layer 206 and the second ME layer 207 that has a magnetization in the direction of the voltage $V_w$, and reduces a magnetization in the other ME controlling layer. According to some aspects, a direction of magnetization of the second ME layer 207 may be parallel to a direct of magnetization of the reference layer 202.

According to some aspects, the directions of magnetization of the first ME layer 206 and the second ME layer 207 are in-plane, and that the directions are opposite one another. Moreover, it should be understood that uniaxial anisotropy refers to a first ME layer having a preferred direction magnetization in one direction (e.g., to the right side of FIG. 2) and a second ME layer having a preferred direction magnetization to an opposite direction (e.g., to the left side of FIG. 2).

According to some embodiments, based on the voltage $V_w$, the magnetic field seen by the free layer 203 can be changed both in its direction and intensity. Thus, according to one or more embodiments, the magnetic field can be employed to induce changes in domains of the free layer 203 to achieve variable magnetization and induce different resistances in the MTJ memory element 201 having the reference layer 202, free layer 203, and the magnetic tunneling layer 204. According to some embodiments, different states (i.e., resistance) in the MTJ memory element 201 can be detected by a reading voltage ($V_R$) on the MTJ memory element.

According to some embodiments, the MTJ memory element 201 is disposed on a read line 210 and under a top contact 211.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

According to some embodiments, a pair of ME layers are used to write different states on the FL of the MTJ memory element. According to one or more embodiments, a net magnetization of the ME layers on the FL can be zero. According to at least one embodiment, the ME layers have in-plane uniaxial anisotropy magnetization in opposite directions, wherein a voltage applied on the ME layers can be controlled to induce a non-zero magnetization on the FL, and to move the magnetic dipoles in the FL in a direction according to the voltage. The voltage applied on the ME layers can be used to induce different magnetizations on the FL and different resistances for the MTJ memory element. It should be understood that MTJ resistance is dependent on an orientation of MTJ magnetization with the parallel and antiparallel states. The switching of the FL, which switches between the parallel and antiparallel states, can be controlled by adjusting a magnetic field generated by the ME layers.

According to some embodiments, the ME layers consume no power in writing data to the MTJ memory element. According to some aspects, the ME layers consume no power because the ME materials are dielectric and applying voltages does not generate current. For example, according to some embodiments, in a write operation, by applying a voltage, the magnetization of both ME layers enhances in one or other direction and applies some non-zero net magnetization in the FL in one or other in-plane direction.

By comparison, a conventional STT-RAM consumes power during the application of a current through an MTJ to write a state. According to some embodiments, for a read of the MTJ memory element, a state of resistance on the analogue (i.e., multi-state) MTJ memory element (e.g., the read line) can be detected.

Figure 1:
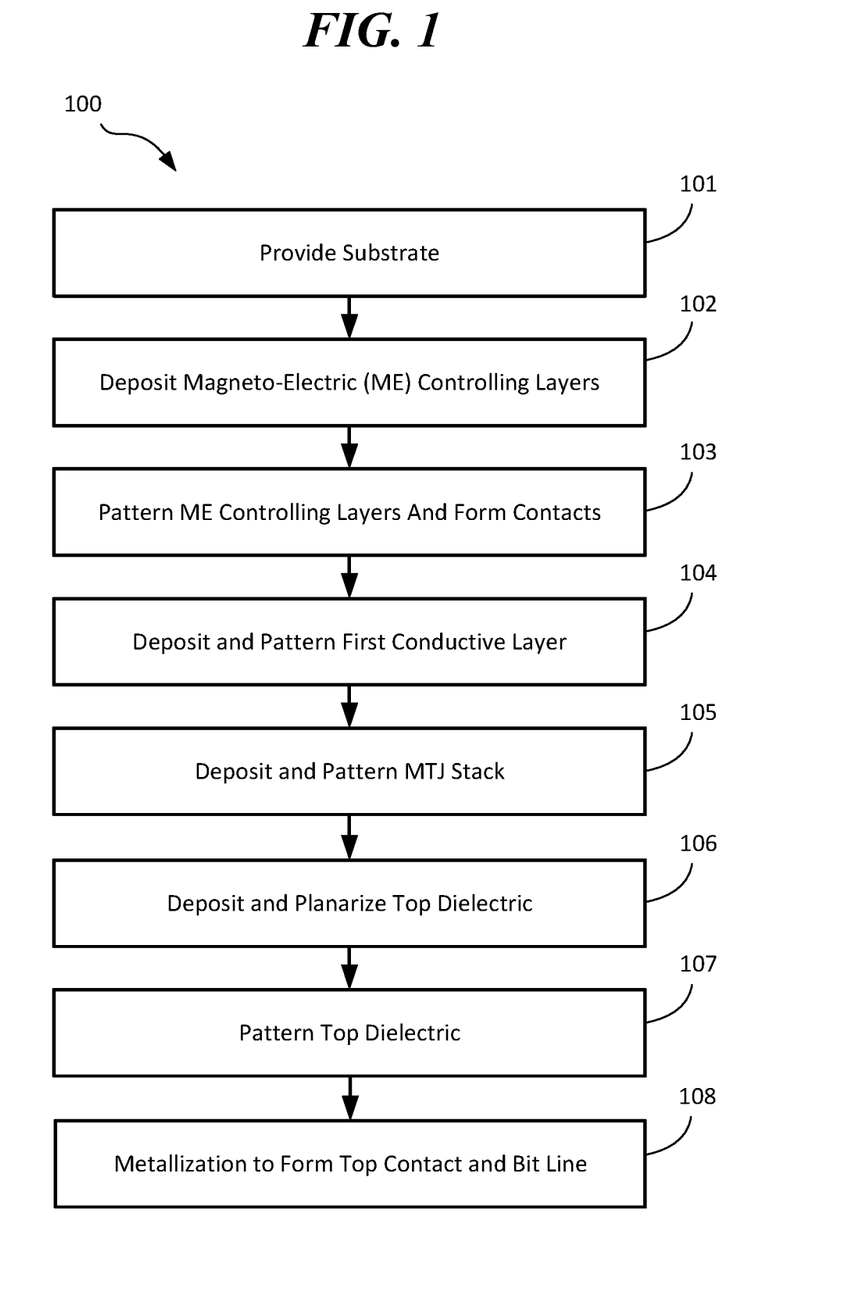
FIG. 1 is method of forming a magnetic domain based device with magnetoelectric layers, a write line, and a decoupled read path according to one or more embodiments of the present invention.

FIG. 1 shows a method 100 of forming a magnetic domain based device with magnetoelectric layers, a write line, and a decoupled read path according to one or more embodiments of the present invention. According to some embodiments of the present invention and referring to FIG. 1, the method 100 of forming a magnetic domain based device with magnetoelectric layers, a write line, and a decoupled read path includes providing a front-end-of-line (FEOL) substrate with bottom connections to an active circuit at step 101. According to some embodiments, the method includes depositing two ME layers with opposite uniaxial anisotropy at step 102. According to some embodiments, the method includes patterning the ME layers, e.g., by Ion Beam Etching (IBE), and forming the first and the second ME controlling contacts on the sides of the ME layers and in contact with the bottom connections at step 103. According to example embodiments, a first conductive layer is deposited and patterned at step 104. The first conductive layer can be formed of, for example, Ruthenium (Ru). According to some embodiments, the first conductive layer is patterned to form a read line. According to at least one aspect, an MTJ stack is deposited and patterned, e.g., by IBE, at step 105. According to some embodiments, the MTJ stack includes a FL, tunnel barrier, and a RL. According to at least one embodiment, a top dielectric is deposited and planarized, e.g., by chemical-mechanical polish (CMP), at step 106. According to some embodiments, the top dielectric is patterned, e.g., by reactive ion etch (RIE), to form a first opening exposing a top of the RL and a second opening exposing a top of the first conductive layer at step 107. According to one or more embodiments, the first and the second openings are filled (e.g., by a metallization and a planarization, for example, by CMP) forming a top contact and a bit line contact, respectively, at step 108.

Figure 3:
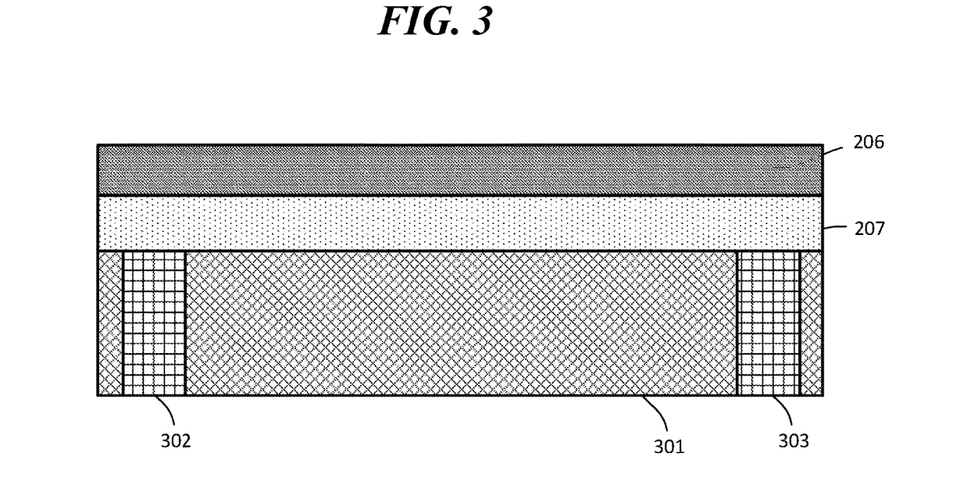
FIGS. 3-9 are cross-section views of a device at different steps in a manufacturing process according to one or more embodiments of the present invention.
Figure 4:
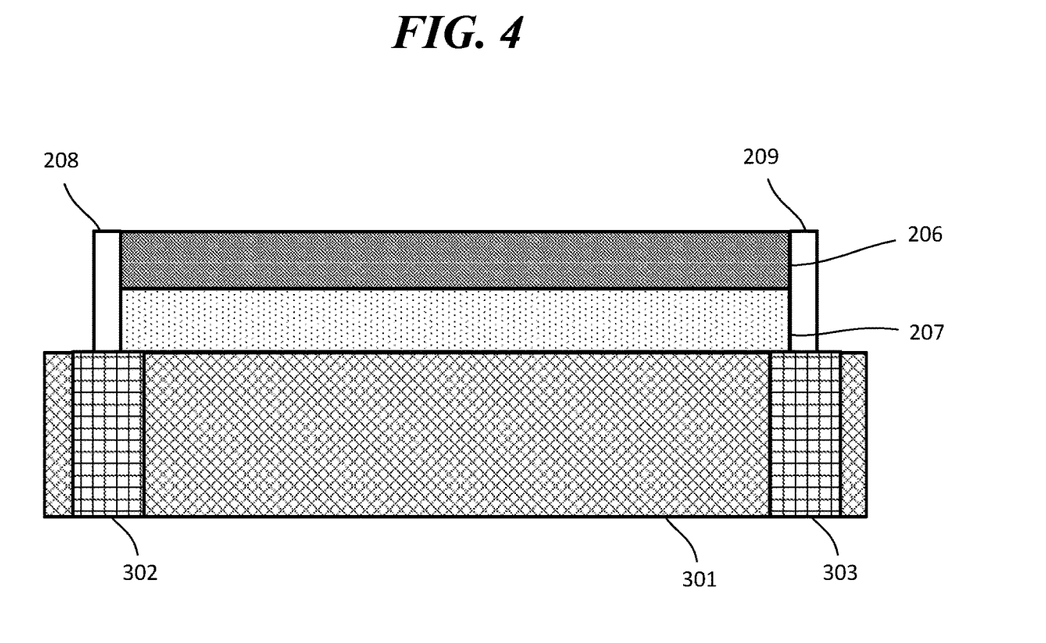
Figure 5:
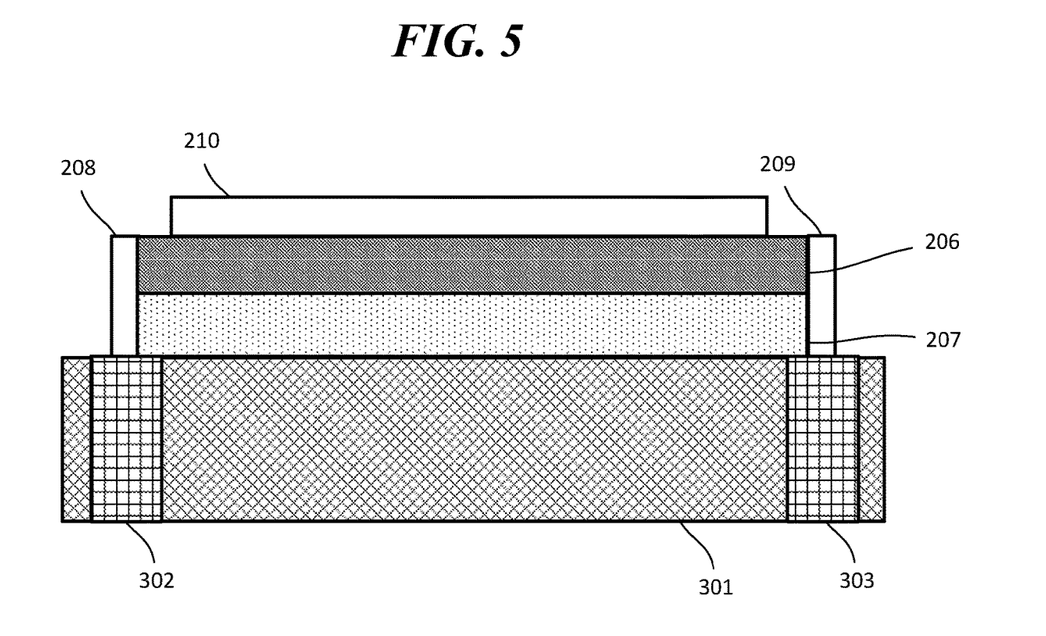
Figure 6:
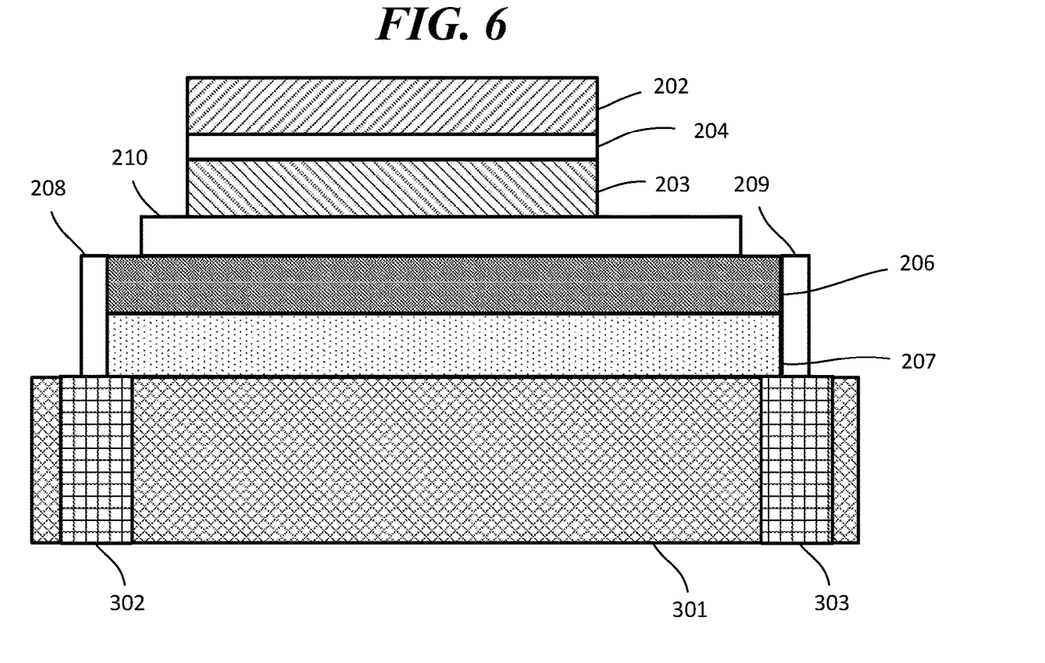
Figure 7:
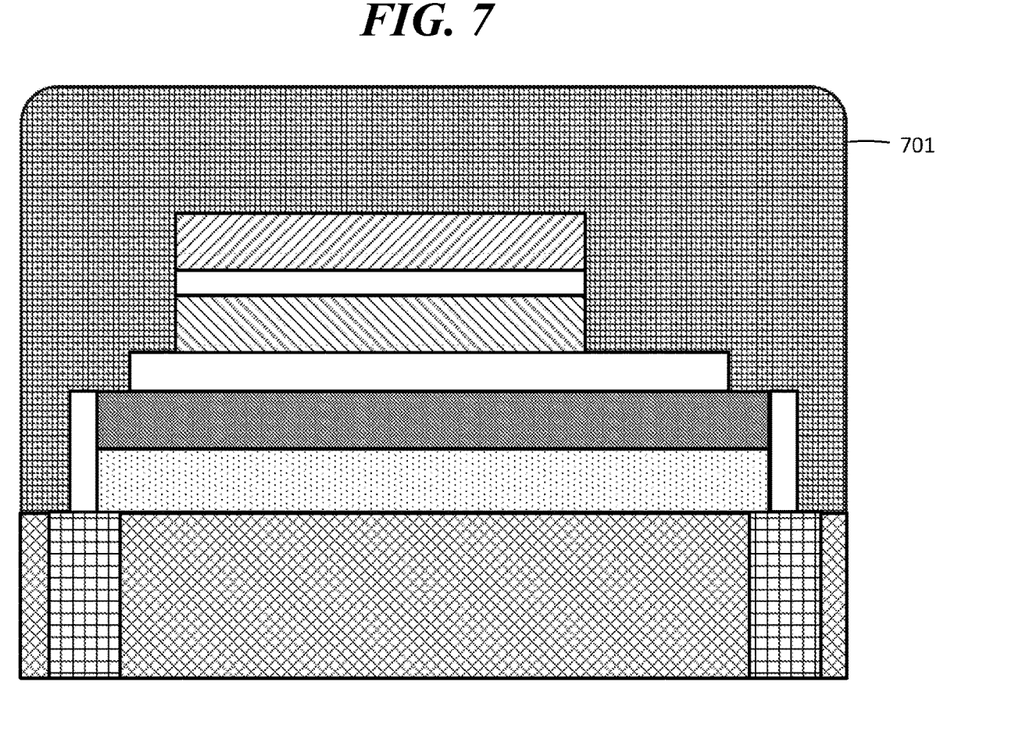
Figure 8:
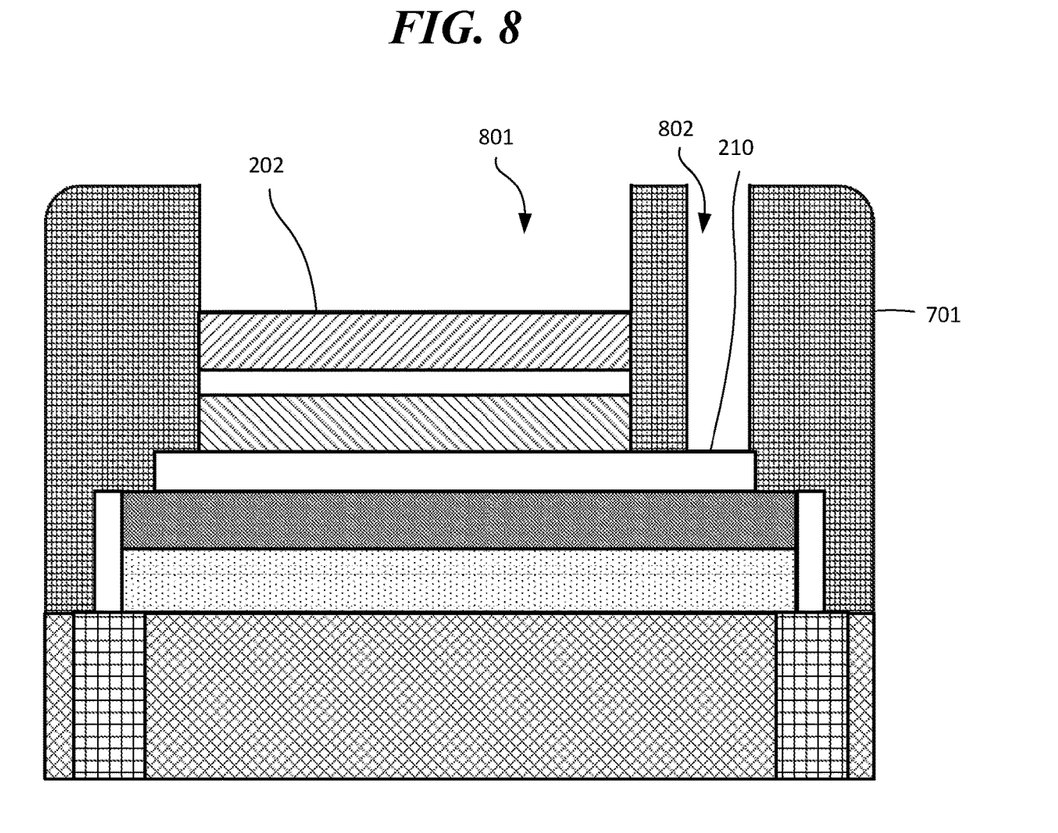

According to some embodiments and referring to FIGS. 3-9, of forming a magnetic domain based device with magnetoelectric layers, a write line, and a decoupled read path according to one or more embodiments of the present invention. According to some embodiments of the present invention and referring to FIG. 3, a front-end-of-line (FEOL) substrate 301 includes bottom connections 302, 303, to an active circuit (not shown). As shown in FIG. 3, a first ME layer 206 and a second ME layer 207 with opposite uniaxial anisotropy are deposited on the substrate 301. According to some embodiments of the present invention and referring to FIG. 4, the first ME layer 206 and the second ME layer 207 are patterned, e.g., by IBE, and the first ME controlling contact 208 and the second ME controlling contact 209 are formed on the sides of the ME layers and in contact with the bottom connections 302, 303. According to some embodiments of the present invention and referring to FIG. 5, a first conductive layer is deposited and patterned forming a read line 210. The read line can be formed of, for example, Ruthenium (Ru). According to some embodiments of the present invention and referring to FIG. 6, an MTJ stack is deposited and patterned, e.g., by IBE, wherein the MTJ stack includes a free layer 203, a magnetic tunneling layer 204, and a reference layer 202. According to some embodiments of the present invention and referring to FIG. 7, a top dielectric 701 is deposited over the device and planarized, e.g., by CMP. According to some embodiments, the top dielectric 701 is patterned, e.g., by reactive ion etch (RIE), to form a first opening 801 exposing a top of the reference layer 202 and a second opening 802 exposing a top of the read line 210. According to some embodiments of the present invention and referring to FIG. 7, the first and the second openings are filled, e.g., by a metallization and CMP, forming a top contact 211 and a bit line contact 901.

Figure 9:
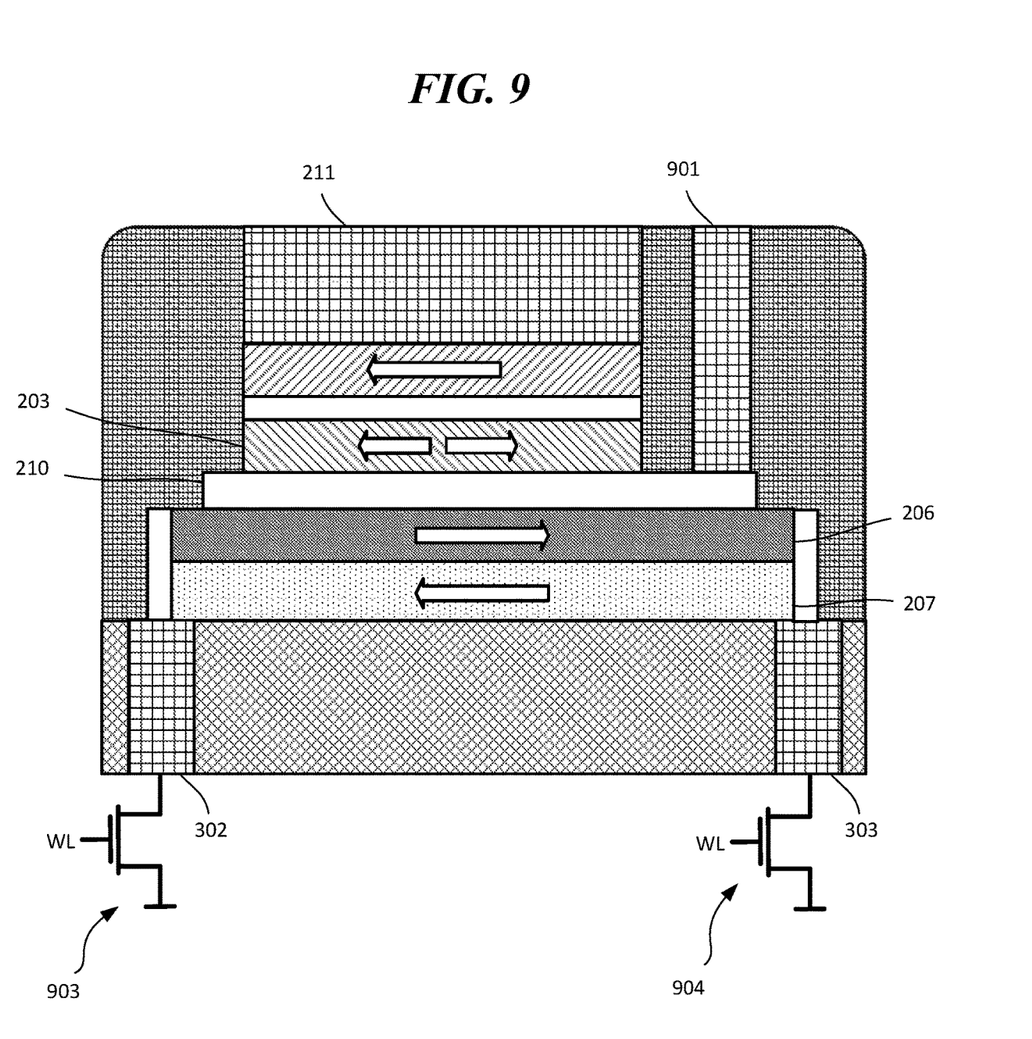

According to some aspects, the bottom connections 302, 303 are connected to respective word lines 903, 904. According to at least one embodiment, the word lines 903, 904 can be used to write data to the device by controlling the voltage across the first ME layer 206 and the second ME layer 207, and the bit line contact 901 can be used to read data from free layer 203, by measuring a voltage between the top contact 211 and the bit line contact 901 of the device. For example, the word lines 903, 904 can apply a signal to a gate, thereby driving a voltage to the bottom connections 302, 303 and the first ME layer 206 and the second ME layer 207. According to some aspects, the word lines 903, 904 can be used to write data to the device by simultaneously controlling the voltage across the first ME layer 206 and the second ME layer 207.

According to some embodiments, the read line 210 is decoupled from the top contact 211.

Figure 10:
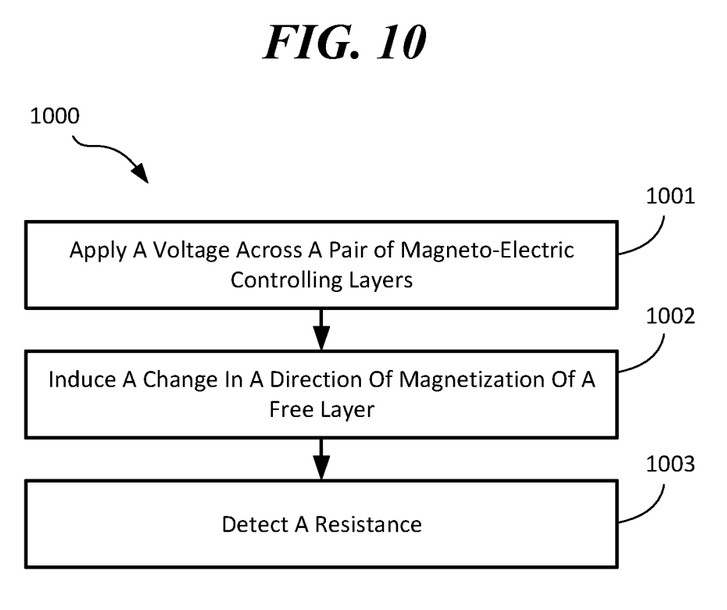
FIG. 10 is method of operating the magnetic domain based device of FIG. 1 according to one or more embodiments of the present invention.

FIG. 10 is method 1000 of operating the magnetic domain based device of FIG. 1 according to one or more embodiments of the present invention. According to some embodiments, the method 1000 of operating the magnetic domain based device comprises applying a voltage across the pair of magneto-electric controlling layers at step 1001, the voltage enhancing a magnetization of one of the magneto-electric controlling layers and reducing a magnetization in the other magneto-electric controlling layer, and controlling a magnetic field formed through the free layer, and inducing, by the magnetic field, a change in a direction of magnetization of the free layer at step 1002, which changes a resistance in the MTJ memory element. According to some embodiments, the application of the voltage across the pair of magneto-electric controlling layers controls a direction and an intensity of the magnetic field formed through the free layer. According to some embodiments, the method includes detecting the resistance in the MTJ memory element by a reading a voltage on the MTJ memory element at step 1003.

Recapitulation:

According to embodiments of the present invention, a device includes a Magnetic Tunnel Junction (MTJ) memory element comprising, a reference layer 202, a free layer 203, and a magnetic tunneling layer 204 between the reference layer and the free layer; and a pair of magneto-electric controlling layers 206, 207, which have in-plane uniaxial anisotropy, wherein the pair of magneto-electric controlling layers are disposed below the free layer.

According to embodiments of the present invention, in a method 1000 of operating a device comprising a Magnetic Tunnel Junction (MTJ) memory element comprising, a reference layer, a free layer, and a magnetic tunneling layer between the reference layer and the free layer, and a pair of magneto-electric controlling layers, which have in-plane uniaxial anisotropy, wherein the pair of magneto-electric controlling layers are disposed below the free layer, the method includes applying a voltage across the pair of magneto-electric controlling layers at step 1001, the voltage enhancing a magnetization of one of the magneto-electric controlling layers and reducing a magnetization in the other magneto-electric controlling layer, and controlling a magnetic field formed through the free layer; and inducing, by the magnetic field, a change in direction of a magnetization of the free layer at step 1002, which changes a resistance in the MTJ memory element.

According to embodiments of the present invention, in a method 100 of manufacturing a device includes providing a front-end-of-line (FEOL) substrate with bottom connections to an active circuit at step 101; forming a pair of magneto-electric controlling layers, which have in-plane uniaxial anisotropy at steps 102-103; forming a first and a second magneto-electric controlling contacts electrically connected to the pair of magneto-electric controlling layers and the bottom connections at step 103; forming a read line on the pair of magneto-electric controlling layers at step 104; forming an Magnetic Tunnel Junction (MTJ) stack comprising, a reference layer, a free layer, and a magnetic tunneling layer between the reference layer and the free layer on the read line at step 105; forming a top contact on the reference layer at step 108; and forming a bit line contact on the read line at step 108.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a Magnetic Tunnel Junction (MTJ) memory element comprising,
   a reference layer,
   a free layer, and
   a magnetic tunneling layer between the reference layer and the free layer; and
   a pair of magneto-electric controlling layers, which have in-plane uniaxial anisotropy, wherein the pair of magneto-electric controlling layers are disposed below the free layer.

2. The device of claim 1, further comprising a plurality of magneto-electric controlling contacts disposed on ends of the pair of magneto-electric controlling layers, and electrically coupled to a plurality of word lines.

3. The device of claim 2, wherein the plurality of magneto-electric controlling contacts and the pair of magneto-electric controlling layers are disposed on a substrate, the substrate comprising a plurality of bottom connections electrically connected to the plurality of magneto-electric controlling contacts.

4. The device of claim 3, wherein the plurality of bottom connections electrically connect the plurality of word lines to the plurality of magneto-electric controlling contacts.

5. The device of claim 1, further comprising a read line disposed between the free layer and the pair of magneto-electric controlling layers.

6. The device of claim 5, further comprising a bit line contact directly contacting the read line.

7. The device of claim 1, further comprising a top contact disposed on the reference layer.

8. The device of claim 1, wherein a top dielectric layer surrounds the device.

9. The device of claim 1, further comprising:
   a read line disposed between the free layer and the pair of magneto-electric controlling layers;
   a bit line contact directly contacting the read line;
   a top contact disposed on the reference layer; and
   a top dielectric layer separating the bit line contact and the top contact.

10. The device of claim 1, wherein the pair of magneto-electric controlling layers are configured to switch a magnetization of the free layer.

11. The device of claim 1, wherein a net magnetization of the pair of magneto-electric controlling layers on the free layer is zero at zero volts across the pair of magneto-electric controlling layers.

12. A method of operating a device comprising a Magnetic Tunnel Junction (MTJ) memory element comprising, a reference layer, a free layer, and a magnetic tunneling layer between the reference layer and the free layer, and a pair of magneto-electric controlling layers, which have in-plane uniaxial anisotropy, wherein the pair of magneto-electric controlling layers are disposed below the free layer, the method comprising:

applying a voltage across the pair of magneto-electric controlling layers, the voltage enhancing a magnetization of a first one of the magneto-electric controlling layers and reducing a magnetization in a second one of the magneto-electric controlling layers, and controlling a magnetic field formed through the free layer; and inducing, by the magnetic field, a change in direction of a magnetization of the free layer, which changes a resistance in the MTJ memory element.

13. The method of claim 12, wherein the application of the voltage across the pair of magneto-electric controlling layers controls a direction and an intensity of the magnetic field formed through the free layer.

14. The method of claim 12, wherein a variable magnetization in the free layer is controlled by the application of the voltage across the pair of magneto-electric controlling layers.

15. The method of claim 12, further comprising detecting the resistance in the MTJ memory element by a reading a voltage on the MTJ memory element.

16. A method of manufacturing a device comprises:
providing a front-end-of-line (FEOL) substrate with bottom connections to an active circuit;

forming a pair of magneto-electric controlling layers, which have in-plane uniaxial anisotropy;

forming a first and a second magneto-electric controlling contacts electrically connected to the pair of magneto-electric controlling layers and the bottom connections;

forming a read line on the pair of magneto-electric controlling layers;

forming a Magnetic Tunnel Junction (MTJ) stack comprising, a reference layer, a free layer, and a magnetic tunneling layer between the reference layer and the free layer on the read line;

forming a top contact on the reference layer; and forming a bit line contact on the read line.

17. The method of claim 16, further comprising:

depositing a top dielectric over the MTJ stack; and patterning the top dielectric to form a first opening exposing a top of the reference layer and a second opening exposing a top of the read line, wherein forming the top contact and forming the bit line contact are performed simultaneously by a metallization and a planarization.

* * * * *